US012616034B2

(12) United States Patent
Hsu et al.

(10) Patent No.: US 12,616,034 B2
(45) Date of Patent: Apr. 28, 2026

(54) CARRIER STRUCTURE

(71) Applicant: SILICONWARE PRECISION INDUSTRIES CO., LTD., Taichung (TW)

(72) Inventors: Cheng-Liang Hsu, Taichung (TW); Wan-Rou Chen, Taichung (TW); Hsin-Yin Chang, Taichung (TW); Tsung-Li Lin, Taichung (TW); Hsiu-Jung Li, Taichung (TW); Chiu-Lien Li, Taichung (TW); Fu-Quan Xu, Taichung (TW); Yi-Wen Liu, Taichung (TW); Chih-Chieh Sun, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 450 days.

(21) Appl. No.: 18/063,426

(22) Filed: Dec. 8, 2022

(65) Prior Publication Data

US 2024/0145398 A1     May 2, 2024

(30) Foreign Application Priority Data

Oct. 26, 2022     (TW) .................................. 111140685

(51) Int. Cl.
| | |
|---|---|
| *H01L 23/52* | (2006.01) |
| *H01L 23/00* | (2006.01) |
| *H01L 23/498* | (2006.01) |
| *H01L 23/544* | (2006.01) |

(52) U.S. Cl.
CPC ...... *H01L 23/544* (2013.01); *H01L 23/49822* (2013.01); *H01L 23/49838* (2013.01); *H01L 24/16* (2013.01); *H01L 2223/54413* (2013.01); *H01L 2223/5442* (2013.01); *H01L 2223/54426* (2013.01); *H01L 2224/16235* (2013.01); *H01L 2924/15174* (2013.01)

(58) Field of Classification Search
None
See application file for complete search history.

(56) References Cited

U.S. PATENT DOCUMENTS

| | | | | |
|---|---|---|---|---|
| 6,278,193 B1* | 8/2001 | Coico | ...................... | H01L 24/81 |
| | | | | 257/E23.179 |
| 6,407,566 B1* | 6/2002 | Brunelle | .............. | G01R 1/0408 |
| | | | | 439/73 |
| 6,593,168 B1* | 7/2003 | Ehrichs | ................... | H01L 24/81 |
| | | | | 257/E23.179 |
| 2004/0130022 A1* | 7/2004 | Shizuno | .............. | H01L 23/3114 |
| | | | | 257/E23.092 |
| 2017/0025384 A1* | 1/2017 | Park | ...................... | H01L 23/481 |
| 2018/0033779 A1* | 2/2018 | Park | ................... | H01L 23/5386 |

(Continued)

*Primary Examiner* — Nicholas J Tobergte
(74) *Attorney, Agent, or Firm* — Studebaker Brackett PLLC

(57)     ABSTRACT

A carrier structure is provided, in which at least one positioning area is defined on a chip-placement area of a package substrate, and at least one alignment portion is disposed on the positioning area. Therefore, the precision of manufacturing the alignment portion is improved by disposing the positioning area on the chip-placement area, such that the carrier structure can provide a better alignment mechanism for the chip placement operation.

7 Claims, 4 Drawing Sheets

(56)        References Cited

U.S. PATENT DOCUMENTS

2018/0240756 A1 *   8/2018   Foo ................... H01L 23/49822
2020/0006164 A1 *   1/2020   Yu ......................... H01L 21/568
2021/0074691 A1 *   3/2021   Lee .................... H01L 21/4857
2024/0049382 A1 *   2/2024   Hsu ..................... H05K 1/0266
2024/0088054 A1 *   3/2024   Lai ..................... H01L 23/3128

* cited by examiner

CARRIER STRUCTURE

BACKGROUND

1. Technical Field

The present disclosure relates to a semiconductor structure, and more particularly, to a carrier structure which can improve process reliability.

2. Description of Related Art

In the early development of semiconductor packaging, a lead frame was used as a carrier for carrying active elements, mainly because the lead frame has the advantages of lower manufacturing cost and higher reliability. However, with the vigorous development of the electronic industry, electronic products tend to be light, thin and short in type, and their functions are developed in the direction of high-performance, high-function and high-speed. Therefore, in order to meet the requirements of high integration and miniaturization of semiconductor devices, lead frames are gradually replaced by packaging substrates with high-density and fine-pitch circuits in the current packaging process.

As shown in FIG. 1A, in a conventional packaging process, a plurality of package substrates 10 are arrayed into a substrate strip 1, and a plurality of positioning holes 100 are formed on the periphery of the substrate strip 1 corresponding to the corners of each package substrate 10, and a plurality of test pads 101 and at least one barcode 102 are arranged on an edge of the substrate strip 1, so that a plurality of semiconductor chips 30 are respectively aligned with the positioning holes 100 in the subsequent packaging process to dispose each of the plurality of semiconductor chips 30 on a chip-placement area D of each of the package substrates 10, as shown in FIG. 1B, and then the semiconductor chips 30 are covered with an encapsulant 32 to obtain a plurality of semiconductor packages 3, and then a lot number of each semiconductor package 3 is identified by using the barcode 102 so as to read the related information of the package substrate 10. Finally, a singulation process is performed to remove the edge of the substrate strip 1, and the positioning holes 100, the test pads 101 and the barcode 102 are removed together.

The package substrate 10 includes a plurality of dielectric layers 10b and a plurality of circuit layers 10a disposed on the plurality of dielectric layers 10b.

The semiconductor chip 30 is electrically connected to the plurality of circuit layers 10a via a plurality of conductive bumps 31 in a flip-chip manner, and a condition of the electrical connection between the semiconductor chip 30 and the plurality of circuit layers 10a is tested by the test pads 101.

However, a layout area of the substrate strip 1 is very large, and merely a small number of positioning holes 100 distributed around the periphery of the substrate strip 1 are used to align the position of the chip-placement area D of each semiconductor chip 30, which may reduce the accuracy and result in frequent shift of the semiconductor chip 30 that causes the problem of poor electrical connection between the package substrate 10 and the semiconductor chip 30.

Therefore, there is a need for a solution that addresses the aforementioned shortcomings in the prior art.

SUMMARY

In view of the aforementioned shortcomings of the prior art, the present disclosure provides a carrier structure, which comprises: a package substrate defined with at least one chip-placement area and at least one positioning area located on the chip-placement area; and an alignment portion disposed on the positioning area.

In the aforementioned carrier structure, the package substrate has a dielectric layer and a circuit layer disposed on the dielectric layer. For example, an insulating protection layer is formed on the outermost dielectric layer of the package substrate.

In the aforementioned carrier structure, the chip-placement area has a plurality of corners, and the positioning area is formed at each of the corners.

In the aforementioned carrier structure, a side length of the positioning area is 4% to 50% of a side length of the chip-placement area. For example, the side length of the positioning area is ¼ of the side length of the chip-placement area.

In the aforementioned carrier structure, the alignment portion is in a form of a groove.

In the aforementioned carrier structure, the alignment portion is a symmetrical pattern.

In the aforementioned carrier structure, the positioning area is formed with a plurality of the alignment portions. For example, the positioning area has a plurality of corners, and the plurality of alignment portions are located at at least two of the plurality of corners of the positioning area.

In the aforementioned carrier structure, the alignment portion comprises a dummy trace formed on the chip-placement area, wherein the package substrate includes an opening formed on the chip-placement area to expose the dummy trace, and another opening formed on the chip-placement area to expose a circuit layer, wherein the circuit layer is formed on the chip-placement area and free from being electrically connected to the dummy trace, and an exposed surface of the circuit layer is used for externally connecting a conductive bump.

As can be understood from the above, in the carrier structure according to the present disclosure, the positioning area is provided on the package substrate to improve the positional accuracy and the dimensional tolerance accuracy of manufacturing the alignment portion, so that the carrier structure can be more suitable or have a better alignment mechanism for disposing electronic elements. Therefore, compared with the prior art, when the semiconductor chip is aligned with the position of the chip-placement area by the alignment portion on the package substrate, the carrier structure can provide better precision in the chip placement operation regardless of the size of the layout area of the carrier structure, so as to avoid the problem of poor electrical connection between the package substrate and the semiconductor chip caused by the shift of the semiconductor chip.

DETAILED DESCRIPTION

Figure 1A:
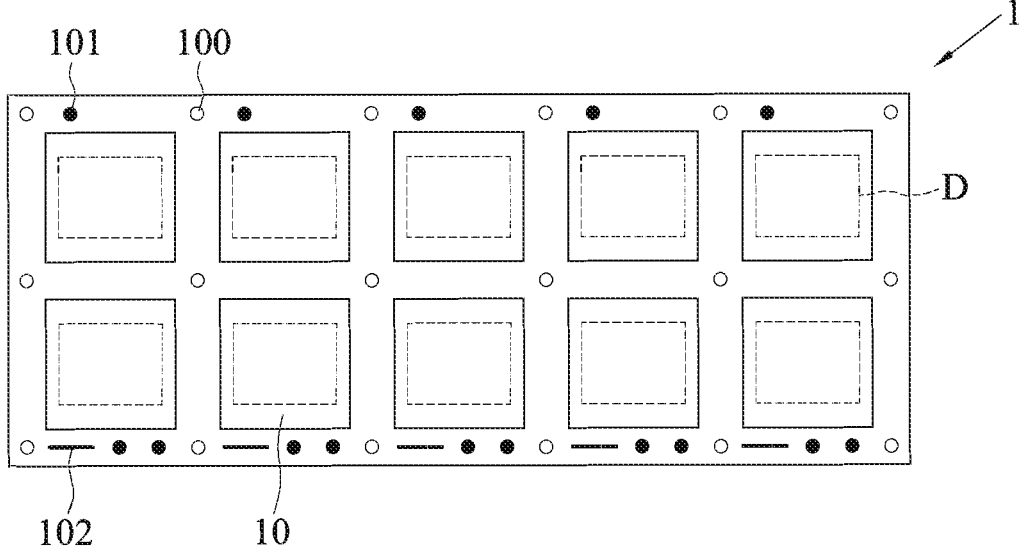
FIG. 1A is a schematic top plan view of a conventional substrate strip.
Figure 1B:
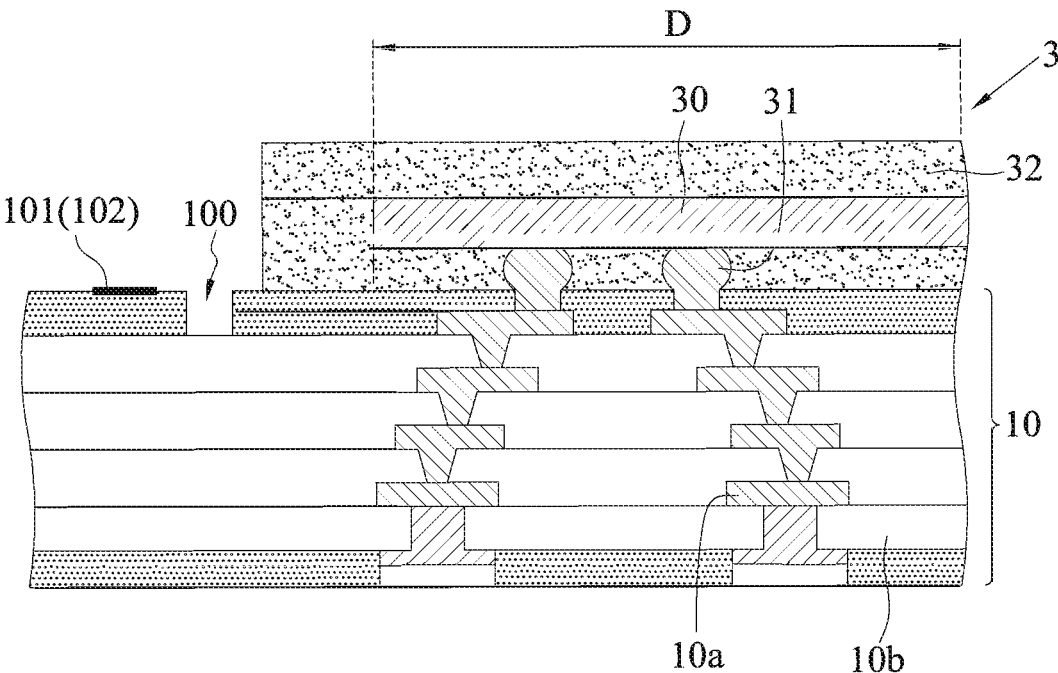
FIG. 1B is a schematic partial cross-sectional view of a conventional semiconductor package.

Implementations of the present disclosure are described below by embodiments. Other advantages and technical effects of the present disclosure can be readily understood by one of ordinary skill in the art upon reading the disclosure of this specification.

It should be noted that the structures, ratios, sizes shown in the drawings appended to this specification are provided in conjunction with the disclosure of this specification in order to facilitate understanding by those skilled in the art. They are not meant, in any ways, to limit the implementations of the present disclosure, and therefore have no substantial technical meaning. Without influencing the effects created and objectives achieved by the present disclosure, any modifications, changes or adjustments to the structures, ratios or sizes are construed as falling within the scope covered by the technical contents disclosed herein. Meanwhile, terms such as "above," "below," "first," "second," "one," "a," "an," and the like, are for illustrative purposes, and are not meant to limit the scope implementable by the present disclosure. Any changes or adjustments made to the relative relationships, without substantially modifying the technical contents, are also to be construed as within the scope implementable by the present disclosure.

Figure 2A:
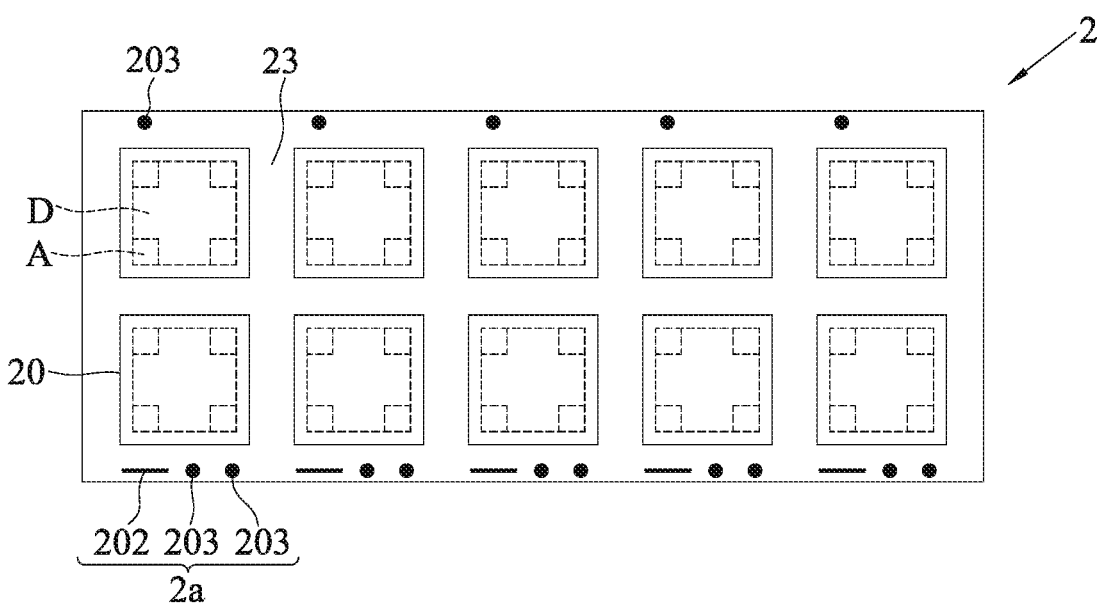
FIG. 2A is a schematic top plan view of a carrier structure according to the present disclosure.

FIG. 2A is a schematic top plan view of a carrier structure 2 according to the present disclosure. As shown in FIG. 2A, the carrier structure 2 comprises: a plurality of package substrates 20 arranged in an array, and a plurality of connecting segments 23 connecting the plurality of package substrates 20.

In an embodiment, the carrier structure 2 is of a full-panel type, such as a substrate strip specification, and a functional element 2a such as a test pad 203 or a barcode 202 is arranged on the connecting segment 23, and each of the package substrates 20 is defined with at least one rectangular chip-placement area D and at least one positioning area A located at the corner of the chip-placement area D to form at least one alignment portion 210, 211 on a single positioning area A. For example, the chip-placement area D is a dummy area, which is an area covered by a vertical projection area of the semiconductor chip 30, so the chip-placement area D corresponds to an outline of the semiconductor chip 30.

Figure 2B:
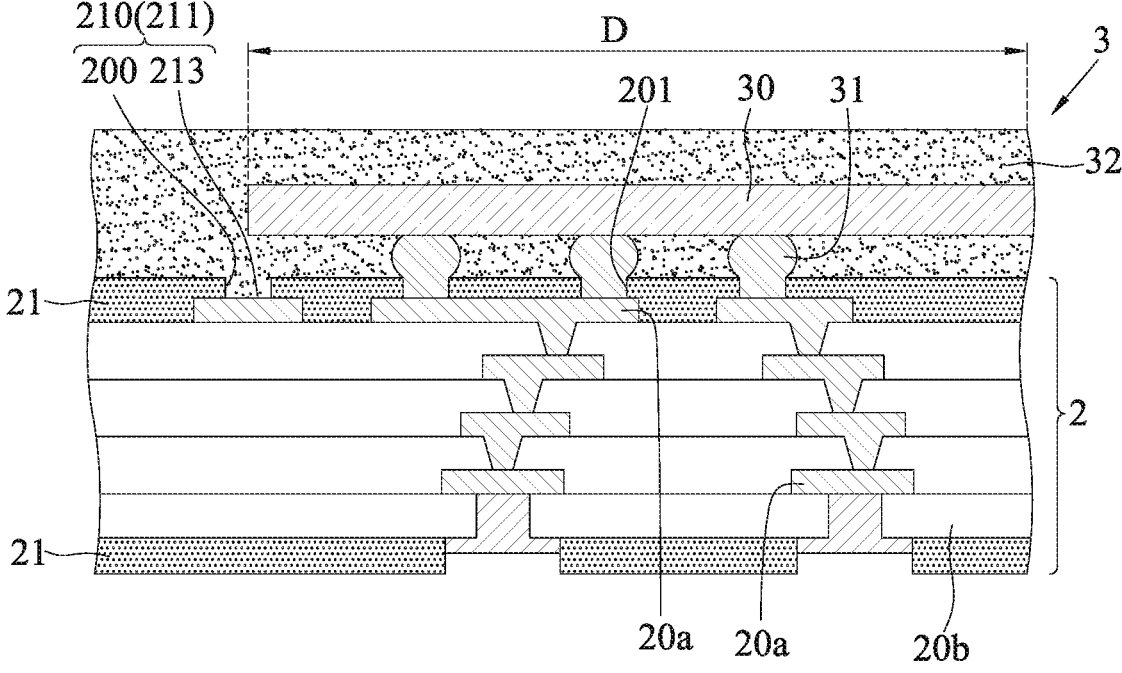
FIG. 2B is a schematic partial cross-sectional view of a semiconductor package made by the carrier structure according to the present disclosure.

Further, the positioning areas A are located at four corners corresponding to the lower part of the semiconductor chip 30, so that the alignment portions 210, 211 are used as positioning mechanism in subsequent packaging processes. For example, when placing an electronic element such as the semiconductor chip 30 (as shown in FIG. 2B) on the chip-placement area D of the package substrate 20, the electronic element can be aligned via the alignment portions 210, 211.

Also, the electronic element(s) can be arranged on each of the package substrates 20 according to the required quantity, and the electronic element may be an active element, an inactive element, or a combination of the active element and the inactive element, wherein the active element is such as a semiconductor chip, and the inactive element is such as a resistor, a capacitor, or an inductor. In an embodiment, the electronic element is a semiconductor chip 30, which can be disposed on the chip-placement area D of the package substrate 20 via a plurality of conductive bumps 31 (as shown in FIG. 2B) in a flip-chip manner; alternatively, the electronic element can be electrically connected to the package substrate 20 in a wire-bonding manner; or, the electronic element can be embedded in the package substrate 20. It should be understood that there are many ways to configure the electronic element and electrically connect the package substrate 20, and the present disclosure is not limited to the above.

In addition, an encapsulation layer (e.g., encapsulant 32) is made of an insulating material, such as polyimide (PI), dry film, epoxy resin, molding compound, or other encapsulants, and the present disclosure is not limited to the above.

Therefore, the carrier structure 2 can be applied to a semiconductor packaging process to obtain a plurality of semiconductor packages 3.

The package substrate 20 is a circuit structure with a core layer or a coreless circuit structure. The package substrate 20 has at least one dielectric layer 20b and at least one circuit layer 20a disposed on the dielectric layer 20b. The circuit layer 20a is such as a fan-out type redistribution layer (RDL), and an insulating protection layer 21 such as a solder-mask layer is formed on the outermost dielectric layer 20b.

In an embodiment, the layout of the package substrate 20 and a chip-placement area D thereof are rectangular, so that each corner of the chip-placement area D is provided with the positioning area A, and the main material for forming the dielectric layer 20b is dielectric materials such as polybenzoxazole (PBO), polyimide (PI), prepreg (PP), etc. It should be understood that the package substrate 20 can be formed with the insulating protection layer 21 or not formed with the insulating protection layer 21 according to requirements. However, the package substrate 20 can also be other carriers for carrying chips. For example, the package substrate 20 can be organic plate, semiconductor material, or other carriers with metal routings, and the present disclosure is not limited to the above.

Furthermore, since the positioning area A is formed in the chip-placement area D, and the wiring/routing of the chip-placement area D is designed to correspond to the line/circuit pitch of the semiconductor chip 30 (such as the pitch between the conductive bumps 31), that is, the pitch is relatively small. Therefore, the alignment portions 210, 211 are fabricated together with the circuit process in the chip-placement area D having dense circuits, and the positions and dimensional tolerances of the alignment portions 210, 211 will be more accurate due to the patterning process of the circuit layer 20a, so that the alignment accuracy can be effectively improved. For example, the positioning area A is a dummy area, which still has the wiring/routing with the function of the circuit layer 20a (such as the conductive bumps 31 corresponding to the semiconductor chip 30), and the alignment portions 210, 211 are merely designed in non-functional routing places of the positioning area A, such as corners.

Figure 3A:
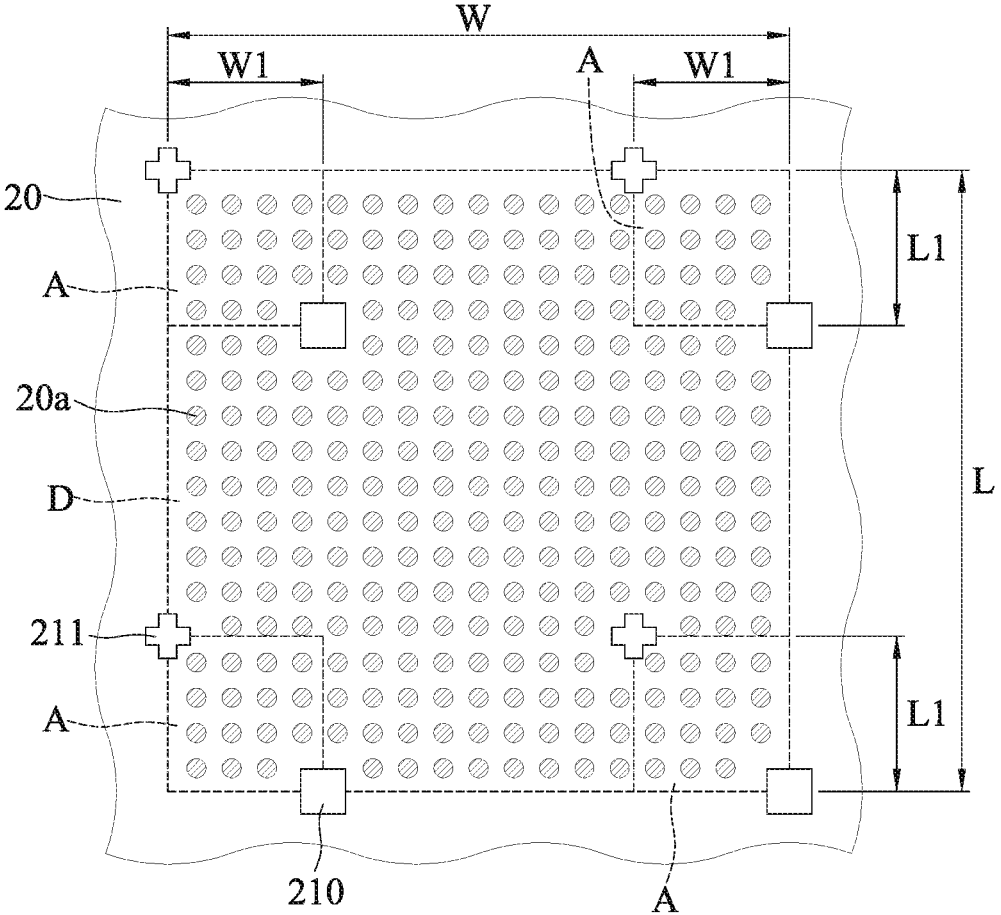
FIG. 3A is a schematic partial enlarged view of FIG. 2A.

Also, the positioning area A is rectangular, as shown in FIG. 3A, the length L1 (the side length) of the positioning area A is 4% to 50% of the length L (the side length) of the chip-placement area D, and the width W1 of the positioning area A is 4% to 50% of the width W of the chip-placement area D. For example, the length L1 of the positioning area A is ¼ of the length L of the chip-placement area D, and the width W1 of the positioning area A is ¼ of the width W of the chip-placement area D.

Figure 3B:
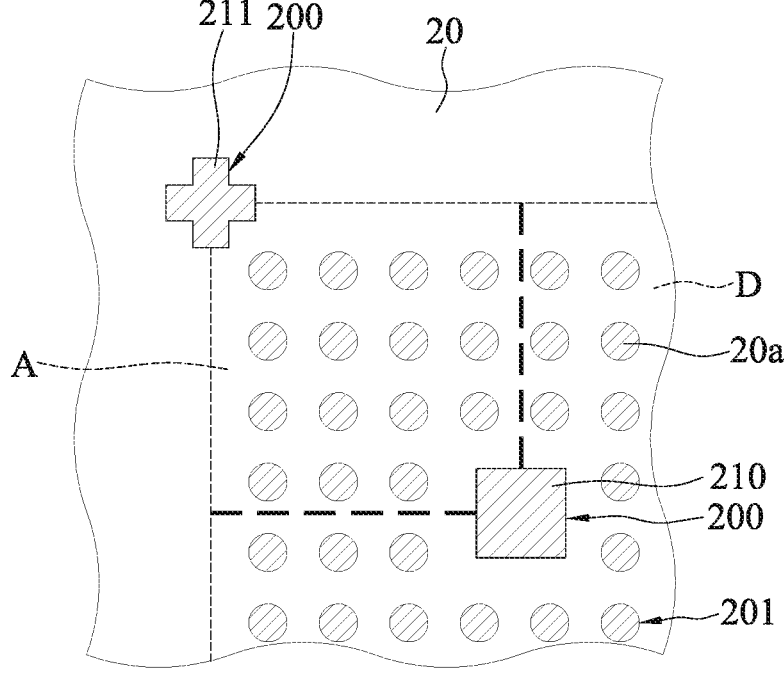
FIG. 3B is a schematic partial enlarged view of FIG. 3A.

In addition, the alignment portions 210, 211 with different symmetrical patterns, such as a cross shape and a rectangular shape as shown in FIG. 3A, can be formed on one of the opposite corners of the positioning area A, respectively. For example, the alignment portions 210, 211 are in the form of grooves, and a plurality of openings 200, 201 can be formed on the insulating protection layer 21, so that part of the opening 200 exposes the dummy trace 213 formed on the dielectric layer 20*b*, as shown in FIG. 2B and FIG. 3B, such that the dummy trace 213 is exposed from the opening 200 of the insulating protection layer 21 for serving as the alignment portions 210, 211, so as to facilitate the position identification in the alignment operation, wherein the dummy traces 213 of the alignment portions 210, 211 are free from being electrically connected to the circuit layer 20*a* and the semiconductor chip 30. In addition, the other openings 201 of the insulating protection layer 21 are used to expose part of the surface of the circuit layer 20*a* for subsequent external connection of the conductive bumps 31.

Therefore, in conjunction with the process of the insulating protection layer 21 and the process of the openings 201 for externally connecting the conductive bumps 31, the openings 200 matched with the alignment portions 210, 211 are simultaneously formed on the chip-placement area D of the package substrate 20, such that the positions for forming the alignment portions 210, 211 will be more precise, and the dimensional tolerance of the patterns of the alignment portions 210, 211 will also be more accurate.

It should be understood that the alignment portions 210, 211 have various aspects, which can be designed according to requirements. For example, the shapes of the two alignment portions are the same or only one of the alignment portions has a dummy trace, and the present disclosure is not limited to the above.

The connecting segments 23 are disposed around the periphery of the package substrate 20, and the connecting segments 23 include at least one insulating layer, so that the functional element 2*a* is formed on the insulating layer.

In an embodiment, the structure of the connecting segments 23 can be fabricated according to the process and structure of the package substrate 20. For example, the insulating layer can be the dielectric layer 20*b* and/or the insulating protection layer 21 without forming a circuit layer, so that the functional element 2*a* is formed on the insulating protection layer 21.

Furthermore, the connecting segments 23 are defined between the package substrates 20 for serving as cutting paths for the singulation process, so as to remove the connecting segments 23, the test pads 203 and the barcode 202, but the alignment portions 210, 211 are kept on the package substrate 20, thereby obtaining a plurality of semiconductor packages 3.

Therefore, in the carrier structure 2 of the present disclosure, the positioning area A is disposed on the chip-placement area D of the package substrate 20 to improve the positional accuracy and dimensional tolerance accuracy of the alignment portions 210, 211, so that the carrier structure 2 can have a better alignment mechanism for arranging the semiconductor chip 30. Therefore, compared with the prior art, when the semiconductor chip 30 is aligned with the position of the chip-placement area D by the alignment portions 210, 211 on the package substrate 20, the carrier structure 2 can provide better precision in the chip placement operation regardless of the size of the layout area of the carrier structure 2, so as to avoid the problem of poor electrical connection between the package substrate 20 and the semiconductor chip 30 caused by the shift of the semiconductor chip 30.

Furthermore, the precision of the chip placement operation can be improved by disposing the two positioning regions A at the two corners (the diagonal corners) of the chip-placement region D of the package substrate 20 respectively.

Also, the precision of the chip placement operation can be improved by disposing the two alignment portions 210, 211 at the two corners (the diagonal corners) of the positioning area A respectively. Preferably, the precision of the chip placement operation can be more improved when the patterns of the two alignment portions 210, 211 are different.

In addition, the precision of the chip placement operation can also be improved by the symmetrical pattern of the alignment portions 210, 211.

In view of the above, in the carrier structure of the present disclosure, the positional accuracy and the dimensional tolerance accuracy of the alignment portions are improved by disposing the positioning area on the package substrate, so that the carrier structure can have a better alignment mechanism for disposing the electronic element, and the carrier structure can thus provide better precision for the chip placement operation, so as to avoid the problem of poor electrical connection between the package substrate and the semiconductor chip caused by the shift of the semiconductor chip. Therefore, the yield and the output of the semiconductor packaging process can be improved.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. A carrier structure, comprising:
a package substrate defined with a chip-placement area for a single chip having a plurality of corners, wherein a positioning area is formed at one of the corners of the chip-placement area;
a first alignment portion with a first pattern; and
a second alignment portion with a second pattern, wherein the first pattern and the second pattern are different, wherein the first alignment portion and the second alignment portion are disposed on the positioning area, wherein the first alignment portion and the second alignment portion are located at two different corners of the positioning area.

2. The carrier structure of claim 1, wherein the package substrate has a dielectric layer and a circuit layer disposed on the dielectric layer.

3. The carrier structure of claim 1, wherein a side length of the positioning area is 4% to 50% of a side length of the chip-placement area.

4. The carrier structure of claim 3, wherein the side length of the positioning area is ¼ of the side length of the chip-placement area.

5. The carrier structure of claim 1, wherein both the first alignment portion and the second alignment portion are in a form of a groove.

6. The carrier structure of claim 1, wherein the first pattern and the second pattern are each symmetrical patterns.

7. The carrier structure of claim 1, wherein the first alignment portion and the second alignment portion comprise a dummy trace formed on the chip-placement area, wherein the package substrate includes an opening formed on the chip-placement area to expose the dummy trace, and another opening formed on the chip-placement area to expose a circuit layer, wherein the circuit layer is formed on the chip-placement area and free from being electrically connected to the dummy trace, and an exposed surface of the circuit layer is used for externally connecting a conductive bump.

* * * * *